(12) United States Patent
Meng et al.

(10) Patent No.: US 10,642,523 B2
(45) Date of Patent: May 5, 2020

(54) METHOD AND APPARATUS FOR UPDATING DATA IN A MEMORY FOR ELECTRICAL COMPENSATION

(71) Applicant: BOE TECHNOLOGY GROUP CO., LTD., Beijing (CN)

(72) Inventors: Song Meng, Beijing (CN); Fei Yang, Beijing (CN); Danna Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 15/567,733

(22) PCT Filed: May 17, 2017

(86) PCT No.: PCT/CN2017/084695
§ 371 (c)(1),
(2) Date: Oct. 19, 2017

(87) PCT Pub. No.: WO2018/045773
PCT Pub. Date: Mar. 15, 2018

(65) Prior Publication Data
US 2018/0293016 A1     Oct. 11, 2018

(30) Foreign Application Priority Data
Sep. 7, 2016   (CN) .......................... 2016 1 0809062

(51) Int. Cl.
*G06F 12/00* (2006.01)
*G06F 13/00* (2006.01)
(Continued)

(52) U.S. Cl.
CPC ............ *G06F 3/0647* (2013.01); *G06F 3/064* (2013.01); *G06F 3/0619* (2013.01);
(Continued)

(58) Field of Classification Search
CPC ...... G06F 3/0647; G06F 3/0619; G06F 3/064; G06F 3/0679; G09G 3/3225; G09G 2330/027
(Continued)

(56) References Cited

U.S. PATENT DOCUMENTS 4,922,241 A * 5/1990 Inoue ................... G09G 3/3629
345/97
4,952,032 A * 8/1990 Inoue ................... G09G 3/3629
345/101
(Continued)

FOREIGN PATENT DOCUMENTS

CN     101088128 A     12/2007
CN     101291558 A     10/2008
(Continued)

OTHER PUBLICATIONS

International Search Report of PCT/CN2017/084695 in Chinese, dated Aug. 15, 2017 with English translation.
(Continued)

*Primary Examiner* — Sheng Jen Tsai
(74) *Attorney, Agent, or Firm* — Collard & Roe, P.C.

(57) ABSTRACT

A method and apparatus for updating data in a memory for electrical compensation, the method comprises: when a master chip receives a power-off signal, writing a serial number of a block being updated or a predetermined value into a nonvolatile memory. In the apparatus, only a nonvolatile memory is required to be provided external to a master chip to store the serial number of the block (the sequence of the block) being updated currently during power-off. Upon a next power-on, it is determined that which rows have their data lost during the previous power-off according to the serial number of the block, and then data of adjacent rows is used to replace the data of the rows which have their data lost during the previous power-off; therefore,
(Continued)

the operation is simple and the efficiency is high, so that the time for updating the data is short, without affecting the memory's lifespan.

16 Claims, 2 Drawing Sheets

(51) Int. Cl.
    *G06F 3/06*     (2006.01)
    *G11C 16/10*     (2006.01)
    *G11C 16/26*     (2006.01)
    *G11C 7/20*     (2006.01)
    *G09G 5/00*     (2006.01)
    *G09G 3/3225*     (2016.01)

(52) U.S. Cl.
    CPC ............. *G06F 3/0679* (2013.01); *G09G 5/00* (2013.01); *G11C 7/20* (2013.01); *G11C 16/105* (2013.01); *G11C 16/26* (2013.01); *G09G 3/3225* (2013.01); *G09G 2300/0819* (2013.01); *G09G 2320/043* (2013.01); *G09G 2330/027* (2013.01)

(58) Field of Classification Search
    USPC ........................................................ 711/103
    See application file for complete search history.

(56) References Cited

U.S. PATENT DOCUMENTS

| | | | | |
|---|---|---|---|---|
| 4,962,376 A * | 10/1990 | Inoue | ................... | G09G 3/36 345/101 |
| 4,964,699 A * | 10/1990 | Inoue | ................... | G09G 3/3629 345/98 |
| 5,233,446 A * | 8/1993 | Inoue | ................... | G09G 3/3629 345/87 |
| 5,590,276 A * | 12/1996 | Andrews | ............. | G06F 11/1441 714/6.21 |
| 5,801,621 A * | 9/1998 | Issa | ..................... | B60R 16/0231 340/439 |
| 6,326,943 B1 * | 12/2001 | Inoue | ................... | G09G 3/3629 345/101 |
| 6,925,523 B2 | 8/2005 | Engel et al. | | |
| 8,065,472 B2 * | 11/2011 | Manus | ................. | G06F 12/0804 711/103 |
| 9,761,170 B2 * | 9/2017 | Chaji | .................... | G09G 3/3208 |
| 9,947,293 B2 * | 4/2018 | Chaji | .................... | G09G 3/3225 |
| 2001/0011318 A1 | 8/2001 | Dalvi et al. | | |
| 2003/0106942 A1 * | 6/2003 | Ohya | ...................... | G06F 21/77 235/492 |
| 2005/0062838 A1 * | 3/2005 | Kudou | ..................... | B41J 2/45 347/238 |
| 2005/0141312 A1 * | 6/2005 | Sinclair | ............... | G06F 11/1072 365/222 |
| 2006/0007096 A1 | 1/2006 | Kawaguichi et al. | | |
| 2006/0098496 A1 | 5/2006 | Kawabata et al. | | |
| 2007/0011581 A1 * | 1/2007 | Nakanishi | .............. | G11C 29/82 714/768 |
| 2007/0083776 A1 * | 4/2007 | Matsushita | ............... | G06F 1/26 713/300 |
| 2008/0071969 A1 * | 3/2008 | Lin | ..................... | G06F 12/0246 711/103 |
| 2008/0071970 A1 * | 3/2008 | Lin | ..................... | G06F 12/0246 711/103 |
| 2008/0091871 A1 * | 4/2008 | Bennett | ............... | G06F 12/0246 711/103 |
| 2008/0091901 A1 * | 4/2008 | Bennett | ............... | G06F 12/0246 711/165 |
| 2008/0258637 A1 | 10/2008 | Leung | | |
| 2009/0100290 A1 * | 4/2009 | Nakanishi | ........... | G11C 11/5628 714/5.1 |
| 2009/0235102 A1 * | 9/2009 | Koshika | ............. | G03G 15/5004 713/324 |
| 2014/0176480 A1 * | 6/2014 | Shepelev | ................ | G06F 3/044 345/174 |
| 2014/0313111 A1 * | 10/2014 | Chaji | .................... | G09G 3/3225 345/82 |
| 2015/0062137 A1 * | 3/2015 | Yu | ........................ | G09G 3/3233 345/531 |
| 2015/0100824 A1 * | 4/2015 | Lucas | ................. | G06F 11/3058 714/22 |
| 2015/0135008 A1 * | 5/2015 | Lucas | ................. | G06F 11/2017 714/14 |
| 2015/0149806 A1 * | 5/2015 | Lucas | ................. | G06F 11/1441 713/330 |
| 2015/0212937 A1 * | 7/2015 | Stephens | ............... | G06F 3/0626 711/103 |
| 2016/0111044 A1 | 4/2016 | Kishi et al. | | |
| 2016/0117974 A1 * | 4/2016 | Back | .................... | G09G 3/3225 345/213 |
| 2016/0343304 A1 * | 11/2016 | Hwang | ................ | G09G 3/3258 |
| 2017/0046084 A1 * | 2/2017 | Hosogaya | .............. | G06F 12/16 |
| 2017/0148521 A1 * | 5/2017 | Xie | ........................ | G06F 3/0619 |
| 2017/0154569 A1 * | 6/2017 | Park | ...................... | G09G 3/2096 |
| 2017/0351900 A1 * | 12/2017 | Lee | ........................ | H04N 5/2257 |
| 2018/0005577 A1 * | 1/2018 | Li | .......................... | G09G 3/2022 |
| 2018/0059665 A1 * | 3/2018 | Shin | ...................... | B64C 39/024 |
| 2018/0061312 A1 | 3/2018 | He et al. | | |

FOREIGN PATENT DOCUMENTS

| | | |
|---|---|---|
| CN | 104505024 A | 4/2015 |
| CN | 104810055 A | 7/2015 |
| CN | 105247603 A | 1/2016 |
| CN | 105513536 A | 4/2016 |
| CN | 105551415 A | 5/2016 |
| CN | 105702207 A | 6/2016 |
| CN | 106328059 A | 1/2017 |
| JP | H08-125914 A | 5/1996 |

OTHER PUBLICATIONS

Notice of Transmittal of the International Search Report of PCT/CN2017/084695 in Chinese, dated Aug. 15, 2017.
Written Opinion of the International Searching Authority of PCT/CN2017/084695 in Chinese, dated Aug. 15, 2017 with English translation of relevant parts.
Chinese Search Report in Chinese Application No. 201610809062.6, dated Feb. 16, 2017 with English translation.
Chinese Office Action in Chinese Application No. 201610809062.6, dated May 4, 2017 with English translation.

* cited by examiner

METHOD AND APPARATUS FOR UPDATING DATA IN A MEMORY FOR ELECTRICAL COMPENSATION

CROSS REFERENCE TO RELATED APPLICATIONS

This application is the National Stage of PCT/CN2017/084695 filed on May 17, 2017, which claims priority under 35 U.S.C. § 119 of Chinese Application No. 201610809062.6 filed on Sep. 7, 2016, the disclosure of which is incorporated by reference.

TECHNICAL FIELD

The present disclosure relates to the field of display technology, and more particularly to method and apparatus for avoiding necessary data loss due to power-off during data update in Nor memory for electrical compensation of AMO-LED (active matrix organic light emitting diode).

BACKGROUND

An AMOLED display element is a self-luminous element based on OLED (organic light emitting diode), and OLED adopts organic semiconductor materials and luminescent materials to conduct carrier injection and recombination under driving of an electric field to emit light. An AMOLED display device has a prospect of being used more widely because of its high luminance, clear picture quality, slim thickness, and excellent display performance.

The AMOLED display device includes tens of thousands of pixels, and each pixel includes an OLED and a pixel circuit for driving the OLED. The pixel circuit comprises a switching TFT (thin film transistor), a capacitor, and a driving TFT. The switching TFT charges a voltage corresponding to a data signal to the capacitor, and the driving TFT adjusts a magnitude of current supplied to the OLED according to a voltage of the capacitor; an amount of light emitted by the OLED is proportional to the current, and thereby luminance of the OLED is adjusted.

However, due to manufacturing issues or the like, there are characteristic variations in threshold voltages Vth of the driving TFTs and mobility among respective pixels, which results in the magnitudes of the currents for driving the OLEDs in the respective pixels are different, and luminance variations appear among the respective pixels. This will cause uneven luminance of the display picture, and may reduce a lifespan of the AMOLED display panel or render an image residue.

In view of the above, it is known to employ a compensation circuit to compensate for Vth drifting. An external compensation is a commonly adopted mode. The external compensation is implemented by adopting a pixel circuit with a compensation function and a customized driving chip to cooperate with each other.

In this compensation process, a large amount of data are computed and accessed to, so a random access memory (e.g., DDR, Double Data Rate synchronous dynamic random access memory) is required for data processing; also, a large amount of intermediate process data is required to be stored for compensation at a next power-on, and thus a memory (e.g., a flash memory chip) for storing electrical compensation data is necessary, and the data needs to be continuously updated with the aging of the TFTs and the OLEDs.

Since the time for the data updating is relatively long, one issue to be faced is that power-off may happen halfway. If data in the memory is just erased from one block, or data updating is being performed but has not been completed, power-off occurring at this moment will cause a loss of compensation data of a part of the pixels, so that the part of the pixels cannot be compensated for at the time of a next power-on.

The conventional data update mode to avoid data loss at power-off is that, each time before data in one block is erased, data in this block is copied to a spare block, and then the block is erased and written for accommodating new data, and a flag bit is modified; if power-off occurs at this moment, the data lost during the previous power-off can be read from the backup block according to the flag bit during a next power-on. The issue with this mode is that the backup block needs to be erased and written every time data of one block is updated; if more than one thousand blocks of the memory are updated each time, the backup block needs to be erased and written more than one thousand times, which seriously reduces a lifespan of the memory, and becomes a bottleneck in the product lifespan. Meanwhile, since data of each block is required to be copied up (involving the erasing and writing of the backup block) before being updated, the updating time is doubled, and the operation on the flag bits is very complicated and requires frequently switching between a reading mode and a writing mode of the memory; since the reading and writing modes of a large amount of data are different from those of a small amount of data, low efficiency occurs in the reading and writing of data.

SUMMARY

Parts of additional aspects and advantages of the present disclosure will be set forth in the description which follows, and parts of them will be obvious from the description, or may be learned in practice of the present disclosure.

In the process of electrical compensation, a large amount of data needs to be stored for compensating for the pixel circuit at the time of a next power-on, so a memory is required to keep data from being lost during power-off, and data in the memory is required to be updated continuously with the aging of the TFTs and the OLEDs. Since the time for the data updating is relatively long, the situation of the power-off should be considered during the updating process. The data updating in the memory requires the block to be erased before new data is written. If the power-off occurs just after data in one block is erased or when data is being written to the block, compensation data of some pixels corresponding to the block might be lost. The conventional mode adopts data backup for each time of data erasing and writing to thereby prevent data from being lost during power-off, but this mode will perform an extremely large number of erasing and writing operations on the backup block, have serious impact on the lifespan of the memory, thus affecting the product lifespan; meanwhile, since data in all the blocks needs to be backed up, the updating time is doubled.

The present disclosure proposes avoiding loss of necessary data due to power-off during the process in which data in the memory is updated upon the real-time electrical compensation. Specifically, a small-capacity nonvolatile memory, such as an E2PROM (Electrically Erasable Programmable Read-Only Memory), is provided external to a master chip (e.g., FPGA, Field-Programmable Gate Array); when the master chip receives a power-off signal, a serial number of the block being updated currently is written into the nonvolatile memory, and this operation can be completed in a very short time (the time is dozens of micro seconds)

and can be completed before power is completely cut off. Then at the time of a next power-on, before compensation data is read from the memory, the serial number of the block as stored in the nonvolatile memory is read first, and which rows of the panel, to which the data stored in the block corresponds, can be derived via a lookup table, so that the compensation data which is lost during the previous power-off can be replaced with the compensation data of several rows which are adjacent to the rows to which the data lost corresponds. Because initial panel properties of several adjacent rows are very close to each other and contents displayed in the several adjacent rows are also very similar during a normal display, the aging degree of the TFTs and the OLEDs in the several adjacent rows is similar to each other, so that similar compensation data can be applied to the several adjacent rows and the data of the adjacent rows can be used to be replaced with each other.

According to the present disclosure, only a nonvolatile memory is required to be arranged externally to the master chip to store the serial number of the block (the sequence number of the block) being currently updated during the power-off. During a next power-on, it is determined that which rows have their data lost during the previous power-off according to the serial number of the block, and then data of adjacent rows is used to replace the data of the rows which have their data lost during the previous power-off; therefore, the operation is simple and the efficiency is high, so that the time for updating the data is short, without affecting the memory's lifespan.

The present disclosure provides a method for updating data in a memory for electrical compensation, the method comprising: when a master chip receives a power-off signal, writing a serial number of a block being updated currently or a predetermined value into a nonvolatile memory.

The present disclosure also provides an apparatus for updating data in a memory for electrical compensation, the apparatus comprising: a nonvolatile memory configured to store data; and a master chip configured to write a serial number of a block being updated currently or a predetermined value into the nonvolatile memory when the master chip receives a power-off signal.

BRIEF DESCRIPTION OF THE DRAWINGS

The above and other objects, features and advantages of the present disclosure will become more apparent from the following detailed description of the embodiments of the present disclosure as provided in conjunction with the accompanying drawings in which the same reference numerals indicate elements of similar structures.

DETAILED DESCRIPTION OF THE EMBODIMENTS

Figure 1:
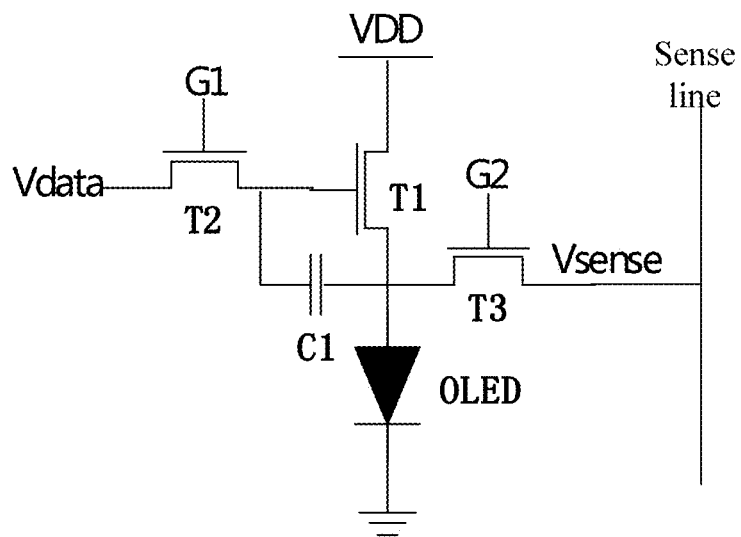
FIG. 1 is a schematic diagram of circuit configuration of a pixel circuit.

Hereinafter, the present disclosure will be described fully with reference to the accompanying drawings that illustrate the embodiments of the present disclosure. However, the present disclosure may be implemented in many different forms and should not be construed as being limited to the embodiments described herein. Contrarily, these embodiments are provided to make the present disclosure be thorough and complete, and to convey the scope of the present disclosure to those skilled in the art. In the drawings, the components are enlarged for clarity.

FIG. 1 is a schematic diagram of a circuit configuration of a pixel circuit. In FIG. 1, only one pixel circuit structure of a pixel in an n-th row and an m-th column is taken as an example.

As illustrated in FIG. 1, the pixel circuit comprises a first transistor T1, a second transistor T2, a third transistor T3, a first capacitor C1, and an organic light emitting diode element OLED. A first scan signal line G1 can input a first scan signal to a gate of the second transistor T2, so that a data voltage Vdata can be transferred to one terminal of the first capacitor C1 and a gate of the first transistor T1 which serves as a driving transistor through a source/drain of the second transistor T2. One of a source and a drain of the driving transistor T1 is connected to an anode of the organic light emitting diode element OLED and the other of a source and a drain of the driving transistor T1 is connected to VDD. The anode of the organic light emitting diode element OLED is also connected to the other terminal of the first capacitor C1, and a cathode of the organic light emitting diode element OLED is connected to a low voltage level. A gate of the third transistor T3 is connected to a second scan signal G2, one of a source and a drain of the third transistor T3 is connected to the anode of the OLED, and the other of a source and a drain of the third transistor T3 is connected to a sense line.

Based on the above structure, when a specific voltage Vdata is supplied, a current Isense flowing through the sense line is measured or a Vsense value is obtained by charge accumulation, and a computation is performed to adjust the data voltage Vdata, thus achieving the compensation effect.

Figure 2:
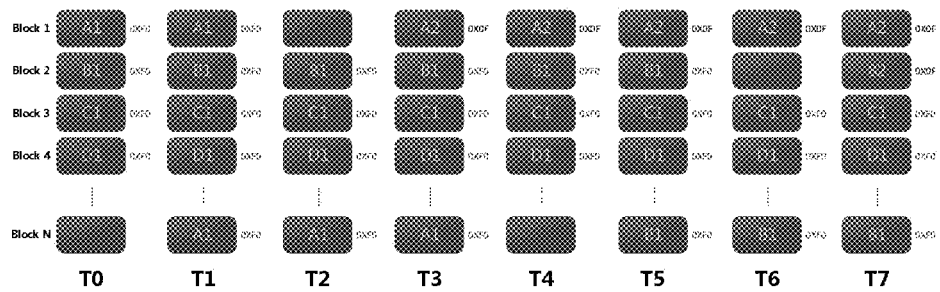
FIG. 2 illustrates a conventional method for updating data which can avoid data loss during the power-off.

FIG. 2 illustrates a conventional method for updating data which can avoid data loss during the power-off. As illustrated in FIG. 2, each time before the data in one block is erased, the data is copied into an empty block, and then the block is erased and written with new data, and a flag bit is modified; if power-off occurs at this moment, the currently lost data can be read from the backup block according to the flag bit during a next power-on.

Figure 3A:
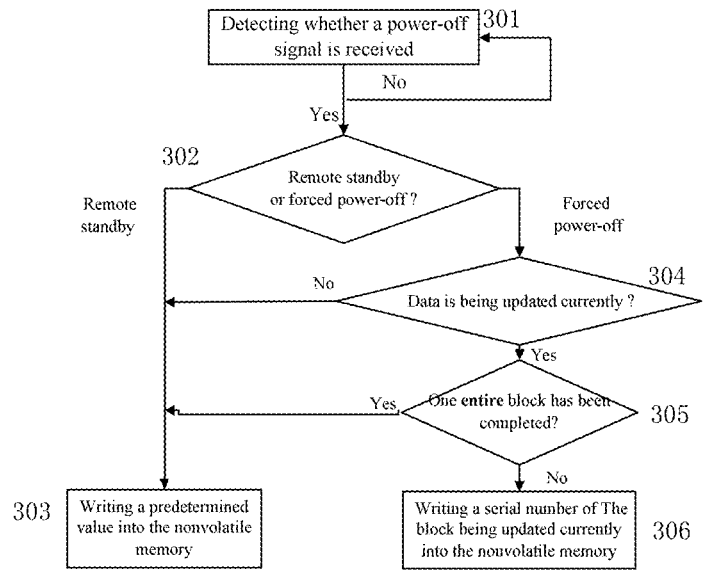
FIGS. 3A and 3B illustrate a flowchart of a method for updating the data in a memory for electrical compensation according to an embodiment of the present disclosure.
Figure 3B:
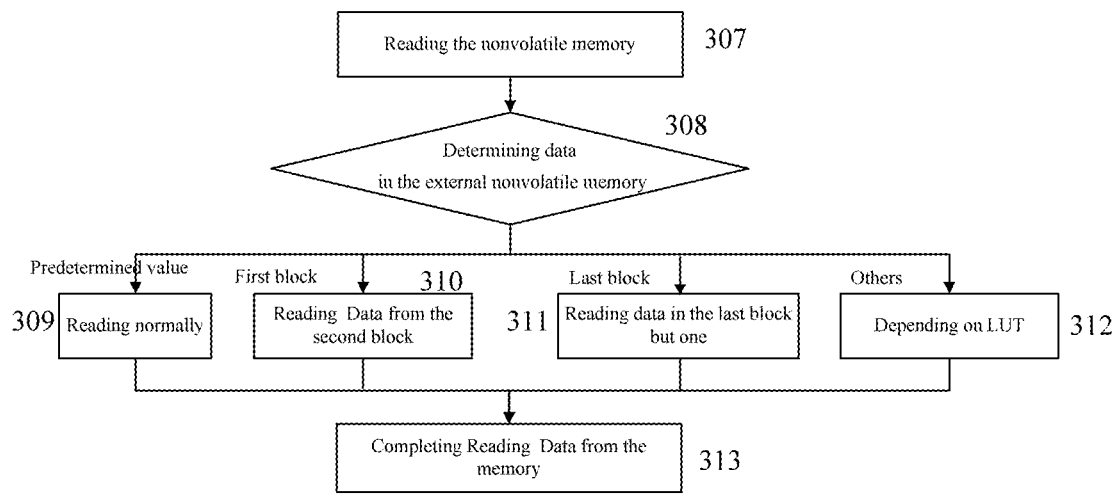

FIGS. 3A and 3B illustrate a flowchart of a method for updating the data in a memory for electrical compensation according to an embodiment of the present disclosure.

FIG. 3A illustrates the operations which are performed at the time of power-off. First, at step 301, it is detected whether a power-off signal is received. If a power-off signal is received, the process proceeds to step 302. If no power-off signal is received, the process returns to step 301 to continue the detection.

The Host has two conventional power-off modes: a remote standby and a forced power-off. In the remote standby, after receiving a remote standby signal, since the power wire is connected, 1 to 2 seconds can be delayed by the power supply board before the power is off, and this time delay can be used to erase and write data in the current block and stop updating data in the memory. In the forced power-off mode, the power wire is directly unplugged, 1 to 2 seconds cannot be available by the power supply board, and only 50 ms can be delayed before the power is down according to the existing industry standard.

At step 302, it is determined that what is received is whether a remote standby signal or a forced power-off signal. If a remote standby signal is received, the process proceeds to step 303. If a forced power down signal is received, the process proceeds to step 304.

At step 303, a predetermined value, for example a value of 0XFFFF, is written into an external nonvolatile memory, indicating that data is not lost.

At step 304, it is determined whether compensation data in the memory is being updated currently.

If the compensation data is being updated currently, the process proceeds to step 305 to detect whether updating of one block has just been completed. If the updating of the one block is not just completed, a serial number of the block being updated currently is written into the nonvolatile memory at step 306.

If no updating for memory is being performed (i.e., negative result is determined at step 304) or updating of one block has been completed (i.e., positive result is determined at step 305), the process proceeds to step 303, at which a predetermined value is written into the nonvolatile memory indicating that there is no data loss; since the operation of writing the predetermined value only needs dozens of micro seconds, the time of 50 ms is sufficient for completing the operation.

When the power is on again, operation steps to be taken are as illustrated in FIG. 3B. After the power is on, at step 307, the data is read from the external nonvolatile memory.

At step 308, the data read from the external nonvolatile memory is judged, i.e., it is determined the data belongs to a predetermined value or to a serial number of a block. If the data belongs to a predetermined value, it indicates that no compensation data has been lost, and the process proceeds to step 309.

At step 309, compensation data is normally read from the memory. Thereafter, the process proceeds to step 313.

If it is determined that the data does not belong to a predetermined value, in other words, that the data belongs to a serial number of a block, it indicates that the compensation data in the block to which this serial number corresponds is lost. Since a size of one block may not be enough to store compensation data of a complete row or several complete rows, it needs to use a lookup table to calculate compensation data of which rows is stored in the current block, and then compensation data in the next several rows or the previous several rows can be used to replace the data in the current block. For the intermediate rows, compensation data in several adjacent rows in an upward direction or in a downward direction can be taken as the replacement; and for the rows at two edges will be processed separately, since the direction in which the data is taken is different.

When the serial number of the current block indicates 1, it indicates that the compensation data in the first block is lost, and the process proceeds to step 310, in which the data is read from the second block, and compensation data in the next several rows is used to replace compensation data in the first block. For example, if the first block stores the compensation data corresponding to more than two rows, data is read from the fourth row of compensation data; for instance, the compensation data corresponds to the fourth to sixth rows are read twice, the data read at the first time is used to replace compensation data corresponding to the first to third rows, and the data read at the second time corresponds to the compensation data of the fourth to sixth rows. Thereafter, the process proceeds to step 313 after completing the sequential reading of the compensation data.

When the serial number of the current block indicates the last block, the process proceeds to step 311, at which step compensation data is sequentially read from the first block until the last block, and compensation data in the last block is replaced with the compensation data of several rows previous to the last block. For example, provided that the last block stores compensation data corresponding to more than one row, the data from the last row but three to the data in the last row but two are read twice, and the data read at the second time is used to replace compensation data in the last block, without reading the compensation data in the last two rows (i.e., compensation data in the last block). Thereafter, the process proceeds to step 313.

When the serial number of the current block indicates a block other than the first block and the last block, the process proceeds to step 312, at which step the compensation data is sequentially read from the first block until the current block, and it is calculated that which rows correspond to compensation data stored in the current block through a lookup table (LUT), and compensation data in several previous rows or in several next rows is read and used to replace the compensation data in the current block. After that, compensation data in the blocks subsequent to the current block is sequentially read, and the process proceeds to step 313.

At step 313, the reading of data from the memory is completed.

Although the replacement data and the actually data would be slightly different from each other, they only correspond to two or three rows, and such differences will not be perceived; thus, the display effect is obviously better than that resulted from the loss of two or three rows of data; moreover, after a period of real-time compensation, all the data would be updated with the actually needed data, and the replacement data does not exist either.

The above-described method for updating data in a memory for electrical compensation according to the embodiment of the present disclosure can be implemented by adding a nonvolatile memory external to the master chip.

The exemplary embodiments of the present disclosure are described by referring to block diagrams and flow charts of method, apparatus (system) and computer program product according to the embodiments of the present disclosure. It should be understood that each flow and/or block in the flow charts and/or block diagrams and the combination of the flow and/or block in the flow charts and/or block diagrams can be implemented by computer program instructions. These computer program instructions can be provided to processors of a general purpose computer, a dedicated computer, or other programmable data processing apparatus to generate a machine, so that means for implementing functions specified in the flow charts and/or the block diagrams are generated by the instructions executed by the processors of the computer or other programmable data processing apparatus.

The terms "first", "second", "third", "fourth" and the like (if present) in the specification and claims are used to distinguish similar elements and are not necessarily used to describe a particular continuous or chronological order. It is to be understood that the terms as used are replaceable in a suitable context, and thus the various embodiments described herein may, for example, operate in a different order than that described herein or otherwise. It should be also noted that, the term "comprising", "including" or any other variation thereof, are intended to cover a non-exclusive inclusion, such that the process, method, article or device comprising a series of elements include not only those elements, but also include other elements which are not explicitly listed herein, or further include features inherent to such process, method, article, or apparatus.

The present disclosure is described with reference to specific embodiments thereof, but it will be understood by those skilled in the art that various changes in terms of form or details may be made without departing from the spirit and scope of the present disclosure as defined by the appended claims.

This application claims priority of Chinese Patent Application No. 201610809062.6 filed on Sep. 7, 2016, the full disclosure of which is incorporated by reference in this patent application as part of the disclosure of the present application.

What is claimed is:

1. A method for updating a main memory comprising a plurality of blocks for storing compensation data for a pixel circuit, the method comprising:
 when a master chip receives a power-off signal, writing, by the master chip, an indication data into a nonvolatile secondary memory, wherein the indication data represents a serial number of a block of the main memory when the compensation data of the block is being updated, and represents a predetermined value when there is no block of the main memory being updated; and
 upon power-on again, reading the indication data, by the master chip, from the nonvolatile secondary memory before the compensation data is read from the block of the main memory; and determining that the compensation data read from the block is used to compensate for the pixel circuit when the indication data represents a predetermined value, and that the compensation data read from the block is not used to compensate for the pixel circuit when the indication data represents a serial number of the block.

2. The method according to claim 1, wherein when the master chip receives the power-off signal, it is determined that the power-off signal is a first power-off signal or a second power-off signal.

3. The method according to claim 2, wherein when the first power-off signal is received, the predetermined value is written into the nonvolatile secondary memory.

4. The method according to claim 2, wherein when the second power-off signal is received, it is determined whether the block is being updated currently and whether the updating of the block has been completed.

5. The method according to claim 4, wherein if the block is being updated currently and the updating of the block has not been completed, the serial number of the block being updated is written into the nonvolatile secondary memory.

6. The method according to claim 4, wherein if no block is being updated or the updating of the block has been completed, the predetermined value is written into the nonvolatile secondary memory.

7. The method according to claim 1, wherein if the indication data read from the nonvolatile secondary memory is the predetermined value, compensation data is read from the block of the main memory to compensate for the pixel circuit;
 if the indication data read from the nonvolatile secondary memory is the serial number of the block, it is determined, according to the serial number of the block, which rows correspond to the compensation data stored in the block through a lookup table, and compensation data of at least one row adjacent to the block is used to replace compensation data in the block.

8. The method according to claim 7, wherein
 when the serial number of the block indicates a first block, compensation data in corresponding rows subsequent to the first block is used to replace compensation data in the first block;
 when the serial number of the block indicates a last block, compensation data in corresponding rows previous to the last block is used to replace compensation data in the last block;
 when the serial number of the block indicates a block other than the first and last blocks, it is determined which rows correspond to the compensation data stored in the block according to the lookup table, compensation data of corresponding rows subsequent or previous to the block is read, and the compensation data of the corresponding rows is used to replace compensation data in the block.

9. An apparatus for updating in a main memory comprising a plurality of blocks for storing compensation data for a pixel circuit, the apparatus comprising:
 a nonvolatile secondary memory; and
 a master chip configured to write an indication data into the nonvolatile secondary memory when the master chip receives a power-off signal, wherein the indication data represents a serial number of a block of the main memory when the compensation data of the block is being updated, and represents a predetermined value when there is no block of the main memory being updated; and
 the master chip is further configured to, upon power-on again, read the indication data, from the nonvolatile secondary memory before the compensation data is read from the block of the main memory; and determining that the compensation data read from the block is used to compensate for the pixel circuit when the indication data represents a predetermined value, and that the compensation data read from the block is not used to compensate for the pixel circuit when the indication data represents a serial number of the block.

10. The apparatus according to claim 9, wherein when the master chip receives the power-off signal, it is determined that the power-off signal is a first power-off signal or a second power-off signal.

11. The apparatus according to claim 10, wherein when the first power-off signal is received, the predetermined value is written by the master chip into the nonvolatile secondary memory.

12. The apparatus according to claim 10, wherein when the second power-off signal is received, it is determined whether the block is being updated currently and whether the updating of block has been completed.

13. The apparatus according to claim 12, wherein if the block is being updated currently and the updating of block has not been completed, the serial number of the block being updated is written into the nonvolatile secondary memory by the master chip.

14. The apparatus according to claim 12, wherein no block is being updated or the updating of the block has been completed, the predetermined value is written into the nonvolatile secondary memory by the master chip.

15. The apparatus according to claim 9, wherein if the indication data read from the nonvolatile secondary memory is the predetermined value, compensation data is read by the master chip from the block of the memory to compensate for the pixel circuit;
 if the indication data read from the nonvolatile secondary memory is the serial number of the block, it is determined by the master chip, according to the serial number of the block, which rows correspond to the compensation data stored in the block through a lookup table, and compensation data of at least one rows adjacent to the block is used by the master chip to replace compensation data in the block.

16. The apparatus according to claim 15, wherein
when the serial number of the block indicates a first block, compensation data in corresponding rows subsequent to the first block is used to replace compensation data in the first block;
when the serial number of the block indicates a last block, compensation data in corresponding rows previous to the last block is used to replace compensation data in the last block;
when the serial number of the block indicates a block other than the first and last blocks, it is determined which rows correspond to the compensation data stored in the block according to the lookup table, compensation data of corresponding rows subsequent or previous to the block is read, and the compensation data of the corresponding rows is used to replace compensation data in the block.

* * * * *